US006278056B1

(12) United States Patent
Sugihara et al.

(10) Patent No.: US 6,278,056 B1
(45) Date of Patent: Aug. 21, 2001

(54) METAL COMPLEX USEFUL AS SENSITIZER, DYE-SENSITIZED OXIDE SEMICONDUCTOR ELECTRODE AND SOLAR CELL USING SAME

(75) Inventors: Hideki Sugihara; Hironori Arakawa; Kazuhiro Sayama; Lok Pratap Singh, all of Tsukuba (JP); Mohammad Khaja Nazeeruddin, Ecublens; Michael Graetzel, Vand, both of (CH)

(73) Assignee: Director-General of Agency of Industrial Science and Technology (JP)

( * ) Notice: Subject to any disclaimer, the term of this patent is extended or adjusted under 35 U.S.C. 154(b) by 0 days.

(21) Appl. No.: 09/271,163

(22) Filed: Mar. 18, 1999

(30) Foreign Application Priority Data

Jul. 15, 1998 (JP) .................................................. 10-199402

(51) Int. Cl.$^7$ ................. H01L 31/0216; H01L 31/0224; C07F 15/00; H01G 9/20
(52) U.S. Cl. .......................... 136/263; 136/252; 136/256; 257/40; 257/428; 257/431; 429/111; 546/2; 546/8; 546/9; 546/10; 546/11; 546/12; 548/101; 548/107; 548/108; 548/109; 556/137; 556/138; 556/140; 556/145; 556/146
(58) Field of Search ..................................... 136/252, 263, 136/256; 257/40, 428, 431; 429/111; 546/2, 8, 9, 10, 11, 12; 548/101, 107, 108, 109; 556/137, 138, 140, 145, 146

(56) References Cited

FOREIGN PATENT DOCUMENTS

| 975026 | * | 1/2000 | (EP) . |
| WO 91/16719 | * | 10/1991 | (WO) . |
| 9116719 | | 10/1991 | (WO) . |
| 9404497 | | 3/1994 | (WO) . |
| 9405025 | | 3/1994 | (WO) . |
| WO 98/50393 | * | 12/1998 | (WO) . |

OTHER PUBLICATIONS

Patent Abstracts of Japan, vol. 1995, #1 May 28, 1995, Abstract for JP 6–279474.

* cited by examiner

Primary Examiner—Alan Diamond
(74) Attorney, Agent, or Firm—Lorusso & Loud

(57) ABSTRACT

A metal complex represented by the formula:

$$(X)_nML^1L^2, (X)_2M(L^1)_2 \text{ or } (L^1)_2ML^2$$

wherein M represents a Group VIII metal, X represents a polar group, $L^1$ represents a phenanthroline containing at least one carboxyl group which may be neutralized, $L^2$ represents a nitrogen-containing polycyclic compound which may contain one or more substituents, and n is an integer of 1 or 2. A dye-sensitized oxide semiconductor electrode includes an electrically conductive body, an oxide semiconductor film provided on a surface of the electrically conductive body, and the above metal complex. A solar cell may be constructed from the above dye-sensitized oxide semiconductor electrode, a counter electrode, and a redox electrolyte contacting with both electrodes.

16 Claims, No Drawings

METAL COMPLEX USEFUL AS SENSITIZER, DYE-SENSITIZED OXIDE SEMICONDUCTOR ELECTRODE AND SOLAR CELL USING SAME

BACKGROUND OF THE INVENTION

This invention relates to a metal complex having an organic dye ligand and to an electrode having a surface on which such a metal complex has been adsorbed. The present invention is also directed to a solar cell using such an electrode.

One known solar cell uses an oxide semiconductor electrode containing titanium oxide. It is also known to adsorb a sensitizing organic dye capable of absorbing a light of a visible region on such an electrode for the purpose of improving light energy absorbing efficiency thereof. The known sensitizing organic dye is, however, not fully satisfactory, because the wavelength region of light which can be absorbed by the dye is not sufficiently broad and because the coefficient of absorption of the dye is not high.

SUMMARY OF THE INVENTION

It is, therefore, the prime object of the present invention to provide a metal complex which can efficiently absorb solar light and which is useful as a sensitizer.

Another object of the present invention is to provide a dye-sensitized oxide semiconductor electrode using the above sensitizer.

It is a further object of the present invention to provide a solar cell using the above electrode, which has a high photoelectric transfer efficiency.

In accomplishing the foregoing objects, there is provided in accordance with the present invention a metal complex represented by one of the following formulas (1)–(3):

$$(X)_n ML^1 L^2 \qquad (1)$$

$$(X)_2 M(L^1)_2 \qquad (2)$$

$$(L^1)_2 ML^2 \qquad (3)$$

wherein M represents a Group VIII metal, X represents a polar group, $L^1$ represents a phenanthroline containing at least one carboxyl group which may be neutralized, $L^2$ represents a nitrogen-containing polycyclic compound which may contain one or more substituents, and n is an integer of 1 or 2.

In another aspect, the present invention provides a dye-sensitized oxide semiconductor electrode comprising an electrically conductive body, an oxide semiconductor film provided on a surface of said electrically conductive body, and the above metal complex adsorbed on said film.

The present invention also provides a solar cell comprising the above dye-sensitized oxide semiconductor electrode, a counter electrode, and a redox electrolyte contacting with said dye-sensitized oxide semiconductor electrode and said counter electrode.

Other objects, features and advantages of the present invention will become apparent from the detailed description of the preferred embodiments of the invention to follow.

DETAILED DESCRIPTION OF THE PREFERRED EMBODIMENTS OF THE INVENTION

In the above formulas (1)–(3), M stands for a metal belonging to Group VIII of the Periodic Table. Illustrative of suitable Group VIII metals are Fe, Ru, Os, Pd, Rh and Ir. Particularly preferred is the use of Fe, Ru or Os.

Any polar group may be used as the group X. Illustrative of suitable polar groups are halogen atoms (such as Cl, Br and I), a thiocyanate group (SCN), a hydroxyl group (OH), a cyan group (CN), an isocyanate group (NCO) and a selenocyan group (SeCN). The polar group serves to improve the adsorbing efficiency of the metal complex on a surface of an oxide semiconductor.

The group $L^1$ represents a first organic ligand and is a phenanthroline containing at least one carboxyl group (COOH) or at least one neutralized carboxyl group (COOM$^1$), where M$^1$ is a cation such as an ammonium ion, a substituted ammonium ion or a metal ion such as an alkali metal ion). The substituted or unsubstituted ammonium ion may be represented by the formula (4):

$$-COO^-.N^+(R^{11})(R^{12})(R^{13})(R^{14}) \qquad (4)$$

wherein $R^{11}$, $R^{12}$, $R^{13}$ and $R^{14}$ each stand for a hydrogen atom or an alkyl group which is preferably a lower alkyl group such as C1 to C4 alkyl group.

The number of the carboxyl group (which may be neutralized) contained in the phenanthroline is at least one, preferably at least 2. The upper limit of the carboxyl group is not specifically limited but is generally 4. The carboxyl group (which may be neutralized) of $L^1$ serves to improve the adsorbing efficiency of the metal complex on a surface of an oxide semiconductor. The phenanthroline can contain one or more substituents such as a hydroxyl group, an alkoxy group, an alkyl group and substituted or unsubstituted amino group. Illustrative of suitable phenanthroline compounds are as follows:

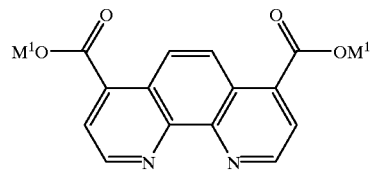

(5)

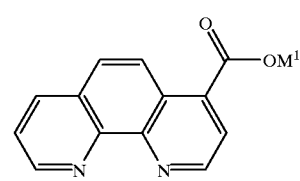

(6)

wherein M$^1$ is as defined above.

The group $L^2$ represents a second organic ligand and is a nitrogen-containing polycyclic compound which may contain one or more substituents. The term "polycyclic compound" herein is intended to refer to a compound having two or more nitrogen-containing rings which may be condensed rings or rings connected to each other through a direct bond or a divalent group. Illustrative of suitable nitrogen-containing polycyclic compounds are as follows:

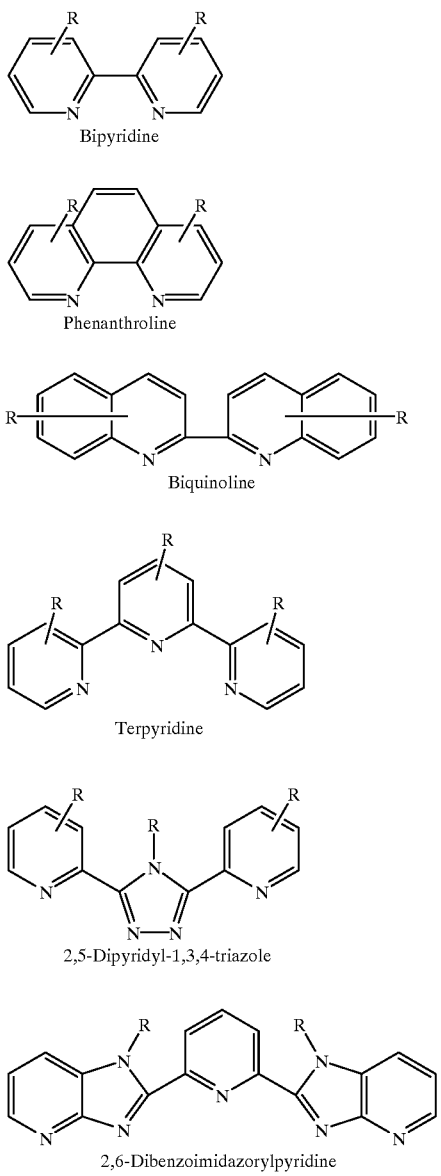

(a) Bipyridine
(b) Phenanthroline
(c) Biquinoline
(d) Terpyridine
(e) 2,5-Dipyridyl-1,3,4-triazole
(f) 2,6-Dibenzoimidazorylpyridine In the above structural formulas (a)–(f), R represents a hydrogen atom or an organic substituent such as a hydroxyl group, a lower alkyl group such as C1–C6 alkyl group, a lower alkoxy group such as C1–C6 alkoxy group, an unsubstituted amino group or an amino group having a substituent such as a lower alkyl group, e.g. C1–C4 alkyl group. The above nitrogen-containing polycyclic compounds are known per se.

The above described metal complex according to the present invention may be produced, for example, as follows.

In the case of the preparation of a metal complex of the formula (2) [RuL$^1_2$(NCS)$_2$], L$^1$ is first produced. For example, in a case where L$^1$ is a compound of the formula (5) in which M$^1$ represents a hydrogen atom, a dialdehyde corresponding to the compound L$^1$ is first refluxed in 70% nitric acid for 3 hours. The reaction mixture is then poured into a vessel containing ice to obtain the compound L$^1$. This is then mixed with 0.5 equivalent of ruthenium chloride and dimethylformaide and the mixture is refluxed to obtain crude RuL$^1_2$Cl$_2$. After purification, 200 mg of RuL$^1_2$Cl$_2$ are mixed with 990 mg of ammonium thiocyanate ((NH4)NCS) and 50 ml of dimethylformamide and the mixture is refluxed for 4 hours to obtain 150 mg of RuL$^1_2$(NCS)$_2$. This is further treated with tetrabutylammonium hydroxide to obtain a compound of the formula:

$$RuL^1_2(NCS)_2 \quad (8)$$

in which L$^1$ represents the compound of the formula (5) in which one of the two M$^1$ radicals is a hydrogen atom and the other M$^1$ is tetrabutylammonium ion [(C$_4$H$_9$)$_4$N]. In the above reaction, the compound of the formula (5) can be replaced by the compound of the formula (6) or by a mixture of the compounds (5) and (6).

By using another Group VIII element in place of Ru, ML$^1_2$(NCS)$_2$ can be obtained in the same manner as above.

By using H$_2$O, (NH$_4$)CN, (NH$_4$)NCO or (NH$_4$)SeCN in place of (NH$_4$)NCS, a metal complex of the formula ML$^1_2$(OH)$_2$, ML$^1_2$(CN)$_2$, ML$^1_2$(NCO)$_2$ or ML$^1_2$(SeCN)$_2$ can be obtained in the same manner as above.

A metal complex of the formula (3) [(L$^1$)$_2$ML$^2$] may be prepared by, for example, reacting RuL$^1_2$Cl$_2$ with a second organic ligand of the formula (a)–(f).

A metal complex of the formula (1) [(X)$_n$ML$^1$L$^2$] may be produced as follows. A halide of a Group VIII metal is reacted with one equivalent of a compound corresponding to the first organic ligand L$^1$ (e.g. a compound of the formula (5) or (6) or a mixture of the compounds (5) and (6)) and then with a compound corresponding to the second organic ligand L$^2$ (e.g. a compound of the formula (a)–(f) or a mixture thereof) to obtain (X)$_n$ML$^1$L$^2$ (X: halide). Alternatively, a halide of a Group VIII metal may be first reacted with one equivalent of a compound corresponding to the second organic ligand L$^2$ and then with a compound corresponding to the first organic ligand L$^1$. If desired, the resulting product (X)$_n$ML$^1$L$^2$ (X: halide) may be reacted with H$_2$O, (NH$_4$)CN, (NH$_4$)NCO or (NH$_4$)SeCN to substitute the halide with OH, CN, NCO or SeCN.

Metal complexes of the formula (1)–(3) in which L$^1$ is a phenanthroline containing at least one carboxyl group (COOH) may be converted into the corresponding metal complexes in which L$^1$ is at least one neutralized carboxyl group (COOM$^1$), by reaction with a M$^1$-containing compound such as ammonium hydroxide or alkyl-substituted ammonium hydroxide.

The metal complex according to the present invention can efficiently absorb light of a wide wavelength and, hence, is suitably used as a sensitizing dye for the fabrication of a dye-sensitized oxide semiconductor electrode.

Such an electrode may be prepared by applying a dispersion or slurry containing fine powder of an oxide semiconductor on an electrically conducting substrate to form a semiconductor layer. A liquid containing the metal complex is then applied to a surface of the semiconductor layer to adsorb the metal complex thereon.

It is preferable that the oxide semiconductor have as small a diameter as possible. Generally the particle size of the oxide semiconductor particles is not greater than 5,000 nm, preferably not greater than 50 nm. The semiconductor particles generally have a specific surface area of at least 5 m$^2$/g, preferably at least 10 m$^2$/g. Any solvent may be used for dispersing the semiconductor particles therein. Water, an organic solvent or a mixture thereof may be used. Illustrative of suitable organic solvents are alcohols such as methanol and ethanol, ketones such as acetone, methyl ethyl ketone and acetyl acetone, and hydrocarbons such as hexane and cyclohexane. Additives such as a surfactant and a thickening agent (e.g. a polyhydric alcohol such as polyethylene glycol)

may be added into the dispersion. The dispersion generally has a content of the oxide semiconductor particles in the range of 0.1–70% by weight, preferably 0.1–30% by weight.

Any conventionally used oxide semiconductor particles may be used for the purpose of the present invention. Examples of oxide semiconductors include oxides of transition metals such as Ti, Nb, Zn, Sn, Zr, Y, La and Ta and perovskite oxides such as $SrTiO_3$ and $CaTiO_3$.

The dispersion is applied onto a surface of a substrate. The coating is then dried and calcined in air or in an inert atmosphere to form a layer of the oxide semiconductor. Any known substrate may be suitably used for the purpose of the present invention. Thus, the substrate may be, for example, a refractory plate such as a glass plate on which an electrically conductive layer such as $In_2O_3$ or $SnO_2$ is laminated, or an electrically conductive metal plate. The thickness of the substrate is not specifically limited but is generally 0.3–5 mm. The laminate is generally transparent or translucent.

The coating of the oxide semiconductor particles, which is low in mechanical strength, is calcined to obtain a calcined or sintered layer having high mechanical strengths and high adhesion to the substrate. The calcination is performed at a temperature of generally not higher than 1,000° C., preferably 300–800° C., more preferably 500–800° C. The calcined layer is preferably porous in nature and preferably has a thickness of at least 10 nm, more preferably 100–10,000 nm, and a ratio of the actual surface area to the apparent surface area of at least 10, more preferably at least 100. The upper limit of the ratio is not specifically limited, but is generally 1,000–2,000. At least 100 of the ratio is preferred for reasons of an increased surface area of a layer of the metal complex formed thereon. The ratio of the actual surface area to the apparent surface area may be controlled by controlling the particle size and the specific area of the oxide semiconductor particles and by controlling the calcination temperature.

The apparent surface area of the calcined layer is intended to refer to an ordinary surface area. For example, when the layer has a rectangular parallelopiped shape, the apparent surface area is a product of the length and the width thereof. The actual surface area is a BET surface area determined by the measurement of an adsorption amount of a krypton gas at liquid nitrogen temperature using a BET surface measuring device (ASAP2000 manufactured by Micromeritex Inc.).

As described previously, a coating liquid containing the metal complex according to the present invention is applied onto a surface of the calcined semiconductor layer to adsorb the metal complex on a surface of the semiconductor layer. The adsorbed metal complex layer is preferably a monomolecular layer. The adsorption may be performed by immersing the substrate having the oxide semiconductor layer in a solution of the metal complex in an organic solvent.

For the purpose of improving the adsorption efficiency of the metal complex, it is desirable to previously remove air bubbles contained in the semiconductor layer by placing the substrate in a reduced pressure environment and/or heating the substrate. The immersion of the substrate is generally performed for 30 minutes to 24 hours. The immersion may be repeated, if necessary. The semiconductor layer on which the sensitizing dye has been adsorbed is then dried at room temperature to about 80° C.

If desired, two or more kinds of sensitizing dyes may be used in combination to broaden a range of wavelengths of light which is absorbed by the dye-sensitized semiconductor layer. To adsorb a plurality of sensitizing dyes, a common solution containing all sensitizing dyes can be used. Alternatively, a plurality of solutions containing respective.dyes can be used.

Any solvent may be used for dissolving the sensitizing dye. Illustrative of suitable solvents are methanol, ethanol, acetonitrile, dimethylformamide and dioxane. The concentration of the dye solution is suitably determined according to the kind of the dye. The sensitizing dye is generally dissolved in the solvent in an amount of 1–10,000 mg, preferably 10–500 mg, per 100 ml of the solvent.

The dye-sensitized oxide semiconductor thus obtained is advantageously used as an electrode for a solar cell. In addition to the above dye-sensitized oxide semiconductor electrode, the solar cell generally has a counter electrode, and a redox electrolyte through which both electrodes contact with each other.

The redox electrolyte may be, for example, $I^-/I_3^-$ system, $Br^-/Br_3^-$ system and quinone/hydroquinone system. Such a redox electrolyte system may be prepared by any electrolyte may be prepared by mixing ammonium iodide with iodine. The electrolyte may be liquid or solid. The solid electrolyte is obtained by dispersing the electrolyte in a polymeric material. In the case of a liquid electrolyte, an electrochemically inert solvent such as acetonitrile, propylene carbonate or ethylene carbonate may be used.

Any electrically conductive material may be used as the counter electrode. Illustrative of suitable counter electrodes are a platinum electrode, a platinum coated conductor electrode, a rhodium electrode, a ruthenium electrode and a carbon electrode.

The two electrodes and electrolyte are accommodated in a case or encapsulated with a resin, in such a state that the dye-sensitized oxide semiconductor electrode is capable of being irradiated with a light. When the semiconductor electrode is irradiated with a light such as solar beam, an electric current flows therebetween because of an electric potential difference therebetween.

The following examples will further illustrate the present invention.

EXAMPLE 1

1,10-Phenanthroline-4,7-dicarboxylic acid (a compound of the formula 5 in which $M^1$ is H) was used as $L^1$. To a solution obtained by dissolving 52 mg (0.5 equivalent) of ruthenium chloride in 30 ml of dimethylforamide, 103 mg of the phenanthroline compound were added. The mixture was then refluxed to form $RuL^1{}_2Cl_2$. The reaction mixture was then purified and evaporated to dryness to obtain $RuL^{11}{}_2Cl_2$ in the form of a solid.

A mixture containing 200 mg of $RuL^1{}_2Cl_2$, 500 mg of ammonium thiocyanate and 30 ml of dimethylformamide was refluxed for 4 hours to obtain 150 mg of $RuL^1{}_2(NCS)_2$. This is further treated with tetrabutylammonium hydroxide to obtain a compound of the formula:

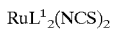

$RuL^1{}_2(NCS)_2$ in which $L^1$ represents the compound of the formula (5) in which one of the two R radicals is a hydrogen and the other R is tetrabutylammonium ion $[(C_4H_9)_4N]$. The elementary analysis of the product revealed a composition: $RuC_{62}H_{86}N_8O_8S_2$. The structure of the product was confirmed by proton NMR analysis, electrospray mass spectrum and UV-visible spectrum. The molar absorptivity of the product was found to be 18,000 at a wavelength of 522 nm which is greater by about 20 in comparison with that of known cis-di(thiocyanate-N)bis(2,2'-pyridyl-4, 4'-dicarboxylate)Ru(II) (molar absorptivity: 14,200 at 534 nm).

EXAMPLE 2

Example 1 was repeated in the same manner as described except that 1,10-phenanthroline-4-carboxylic acid (a compound of the formula (6) in which $M^1$ is H) was used as $L^1$, thereby obtaining a compound of the formula:

$$RuL^1{}_2(NCS)2$$

in which $L^1$ represents the compound of the formula (6) in which $M^1$ radical is H. The structure of the product was elucidated in the same manner as that in Example 1.

EXAMPLE 3

Example 1 was repeated in the same manner as described except that iron chloride or osmium chloride was substituted for the ruthenium chloride to obtain a metal complex of the formula $ML^1{}_2(NCS)_2$ where M is Fe or Os.

EXAMPLE 4

Example 1 was repeated in the same manner as described except that $H_2O$, $(NH_4)CN$, $(NH_4)NCO$ or $(NH_4)SeCN$ was substituted for $(NH_4)NSC$, thereby obtaining $RuL^1{}_2(OH)_2$, $RuL^1{}_2(CN)_2$, $RuL^1{}_2(NCO)_2$ and $RuL^1{}_2(SeCN)_2$.

EXAMPLE 5

A mixture containing 200 mg of $RuL^1{}_2CL_2$ obtained in Example 1, 50 mg of phenanthroline (compound (b) in which R is H) as a second ligand $L^2$ and 30 ml of dimethylformamide was refluxed to obtain $RuL^1{}_2L^2$.

EXAMPLE 6

A mixed liquid containing water (20 parts by volume), acetyl acetone (1 part by volume) and a nonionic surfactant was dispersed $TiO_2$ powder (P-25 manufactured by Nippon Aerosil Co., Ltd., surface area: 55 m²/g, particle diameter: less than 50 nm) to obtain a slurry containing about 1 wt % of the $TiO_2$ powder. The slurry was applied on a surface of an electrically conductive glass substrate (F—$SnO_2$, 10 Ω/sq, thickness: 1 mm), and the coating was dried and calcined at 500° C. for 1 hour in air to form a calcined film (semiconductor layer) having a thickness of 7 μm on the surface of the substrate. The calcined film was found to have a ratio of the actual surface area to the apparent surface area of 500.

The semiconductor film-bearing substrate thus obtained was immersed in a solution of $RuL^1{}_2(NCS)_2$ obtained in Example 1 dissolved in ethanol (concentration: 100 mg/100 ml) at 80° C. under reflux. The treated substrate was then dried at room temperature to obtain a dye-sensitized oxide semiconductor electrode. A cell was constructed using the semiconductor electrode and a counter electrode which was an electrically conductive glass having deposits of a Pt layer having a thickness of 20 nm. The two electrodes were spaced apart from each other to define a gap of 1 mm therebetween. In the gap, a redox electrolyte was placed. The electrolyte was a mixed liquid (composed of 80 parts by volume of ethylene carbonate and 20 parts by volume of acetonitrile) containing 0.46 M of tetrapropylammonium iodide and 0.6 M of iodine.

The thus constructed cell (area of 1 cm×1 cm) was irradiated with light from a xenon lamp (50 mW/cm²) through a filter cutting light of wavelength below 420 nm. As a consequence, a photoelectric current of 6.5 mA and 0.67 V was found to be obtained.

EXAMPLE 7

Example 6 was repeated in the same manner as described except that niobium oxide ($Nb_2O_5$, surface area: 99 m²/g, particle diameter: less than 50 nm) was substituted for titanium oxide. The calcined film (semiconductor layer) was found to have a ratio of the actual surface area to the apparent surface area of 850. A photoelectric current of 0.739 mA and 0.64 V was found to be obtained upon irradiation with the xenon lamp.

EXAMPLE 8

Example 6 was repeated in the same manner as described except that indium oxide ($In_2O_3$, surface area: 25 m²/g, particle diameter: less than 50 nm) was substituted for titanium oxide. The calcined film (semiconductor layer) was found to have a ratio of the actual surface area to the apparent surface area of 200. A photoelectric current of 0.685 mA and 0.110 V was found to be obtained upon irradiation with the xenon lamp.

EXAMPLE 9

Example 6 was repeated in the same manner as described except that tin oxide ($SnO_2$, surface area: 60 m²/g, particle diameter: less than 50 nm) was substituted for titanium oxide. The calcined film (semiconductor layer) was found to have a ratio of the actual surface area to the apparent surface area of 500. A photoelectric current of 1.72 mA and 0.307 V was found to be obtained upon irradiation with the xenon lamp.

EXAMPLE 10

Example 6 was repeated in the same manner as described except that zinc oxide (ZnO, surface area: 20 m²/g, particle diameter: less than 50 nm) was substituted for titanium oxide. The calcined film (semiconductor layer) was found to have a ratio of the actual surface area to the apparent surface area of 200. A photoelectric current of 1.34 mA and 0.577 V was found to be obtained upon irradiation with the xenon lamp.

What is claimed is:

1. A metal complex represented by the following formula:

$$(X)_n ML^1 L^2$$

wherein M represents a Group VIII metal, X represents a polar group, $L^1$ represents a phenanthroline selected from the group consisting of 1,10-phenanthroline-4,7-dicarboxylic acid, 1,10-phenanthroline-4-carboxylic acid and salts thereof, $L^2$ represents a nitrogen-containing polycyclic compound, and n is an integer of 1 or 2.

2. A metal complex represented by the following formula:

$$(X)_2 M(L^1)_2$$

wherein M represents a Group VIII metal, X represents a polar group, and $L^1$ is selected from the group consisting of 1,10-phenanthroline-4,7-dicarboxylic acid, 1,10-phenanthroline-4-carboxylic acid and salts thereof.

3. A metal complex represented by the following formula:

$$(L^1)_2 ML^2$$

wherein M represents a Group VIII metal, $L^1$ represents a phenanthroline selected from the group consisting of 1,10-phenanthroline-4,7-dicarboxylic acid, 1,10-phenanthroline-4-carboxylic acid and salts thereof, and $L^2$ represents a nitrogen-containing polycyclic compound.

4. A dye-sensitized oxide semiconductor electrode comprising an electrically conductive body, an oxide semiconductor film provided on a surface of said electrically conductive body, and the metal complex according to claim 1 adsorbed on said film.

5. A solar cell comprising the dye-sensitized oxide semiconductor electrode according to claim 4, a counter electrode, and a redox electrolyte contacting with said dye-sensitized oxide semiconductor electrode and said counter electrode.

6. A dye-sensitized oxide semiconductor electrode comprising an electrically conductive body, an oxide semiconductor film provided on a surface of said electrically conductive body, and the metal complex according to claim 2 adsorbed on said film.

7. A dye-sensitized oxide semiconductor electrode comprising an electrically conductive body, an oxide semiconductor film provided on a surface of said electrically conductive body, and the metal complex according to claim 3 adsorbed on said film.

8. A solar cell comprising the dye-sensitized oxide semiconductor electrode according to claim 6, a counter electrode, and a redox electrolyte contacting with said dye-sensitized oxide semiconductor electrode and said counter electrode.

9. A solar cell comprising the dye-sensitized oxide semiconductor electrode according to claim 7, a counter electrode, and a redox electrolyte contacting with said dye-sensitized oxide semiconductor electrode and said counter electrode.

10. A metal complex according to claim 1 wherein M is a metal selected from the group consisting of Fe, Ru, Os, Pd, Rh and Ir.

11. A metal complex according to claim 2 wherein M is a metal selected from the group consisting of Fe, Ru, Os, Pd, Rh and Ir.

12. A metal complex according to claim 3 wherein M is a metal selected from the group consisting of Fe, Ru, Os, Pd, Rh and Ir.

13. A metal complex according to claim 1 wherein X is a polar group selected from the group consisting of halogen, a thiocyanate group, a hydroxyl group, a cyan group, an isocyanate group and a selenocyan group.

14. A metal complex according to claim 2 wherein X is a polar group selected from the group consisting of halogen, a thiocyanate group, a hydroxyl group, a cyan group, an isocyanate group and a selenocyan group.

15. A metal complex according to claim 1 wherein $L^2$ is a compound selected from the group consisting of bipyridine, biquinoline, terpyridine, 2,5-dipyridyl-1,3,4-triazole and 2,6-dibenzoimidazorylpyridine and said compounds substituted by C1–C6 alkyl, C1–C6 alkoxy, amino and amino substituted with at least one C1–C4 alkyl.

16. A metal complex according to claim 3 wherein $L^2$ is a compound selected from the group consisting of bipyridine, biquinoline, terpyridine, 2,5-dipyridyl-1,3,4-triazole and 2,6-dibenzoimidazorylpyridine and said compounds substituted by C1–C6 alkyl, C1–C6 alkoxy, amino and amino substituted with at least one C1–C4 alkyl.

* * * * *